US010080301B2

(12) United States Patent
Passmore et al.

(10) Patent No.: US 10,080,301 B2
(45) Date of Patent: Sep. 18, 2018

(54) HIGH VOLTAGE POWER CHIP MODULE

(71) Applicant: Cree Fayetteville, Inc., Fayetteville, AR (US)

(72) Inventors: Brandon Passmore, Fayetteville, AR (US); Zachary Cole, Summers, AR (US); Brice McPherson, Fayetteville, AR (US)

(73) Assignee: Cree, Inc., Durham, NC (US)

( * ) Notice: Subject to any disclaimer, the term of this patent is extended or adjusted under 35 U.S.C. 154(b) by 518 days.

(21) Appl. No.: 14/516,700

(22) Filed: Oct. 17, 2014

(65) Prior Publication Data

US 2015/0131236 A1 May 14, 2015

Related U.S. Application Data

(60) Provisional application No. 61/892,187, filed on Oct. 17, 2013.

(51) Int. Cl.
*H05K 7/02* (2006.01)
*H01L 25/00* (2006.01)
*H05K 7/14* (2006.01)

(52) U.S. Cl.
CPC ............. *H05K 7/02* (2013.01); *H01L 25/00* (2013.01); *H05K 7/1432* (2013.01); *H01L 2924/0002* (2013.01)

(58) Field of Classification Search
CPC ........ H05K 7/02; H05K 7/1432; H01L 25/00; H01L 2924/0002

(Continued)

(56) References Cited

U.S. PATENT DOCUMENTS 5,471,089 A * 11/1995 Nagatomo ............. H01L 23/50
257/691
5,705,775 A * 1/1998 Ishihara ................. H01T 19/02
174/140 CR (Continued)

FOREIGN PATENT DOCUMENTS

WO 2014090686 A1 6/2014

OTHER PUBLICATIONS

R.K. Ulrich and W.D. Brown, "Advanced Electronic Packaging," New Jersey: John Wiley & Sons, Inc., 2006, p. 203.

(Continued)

*Primary Examiner* — Michael P McFadden
(74) *Attorney, Agent, or Firm* — Anthony J. Josephson

(57) ABSTRACT

A power die module using a compression connection to a power die in a small package with corona extenders positioned around short efficient path exterior electrical connections. The module is built from a baseplate with connected sidewalls forming an interior compartment holding a power substrate with attached threaded inserts. A printed circuit board bolted to the power substrate with high voltage power die compressively held between the board and the substrate. The compressive hold enhances the electrical connections between the contacts on the top and bottom of the power die and either the power substrate or the printed circuit board. Exterior blade connectors extend upward from the printed circuit board through blade apertures in a lid that covers the interior compartment. The lid includes corona extenders positioned around the blade apertures to allow for high voltage applications while maintaining a small size lightweight package. The sidewall has a perimeter that also includes one or more corona extenders.

21 Claims, 12 Drawing Sheets

(58) Field of Classification Search
USPC .............. 361/752, 719–718, 728; 174/250, 174/261–266
See application file for complete search history.

(56) References Cited

U.S. PATENT DOCUMENTS

| | | | |
|---|---|---|---|
| 5,835,356 A | 11/1998 | Wieloch et al. | |
| 6,000,034 A * | 12/1999 | Lightbody | G01R 22/066 340/870.02 |
| 6,307,755 B1 | 10/2001 | Williams et al. | 361/813 |
| 6,400,577 B1 | 6/2002 | Goodwin et al. | |
| 7,687,903 B2 | 3/2010 | Son et al. | 257/723 |
| 7,786,486 B2 | 8/2010 | Casey et al. | 257/76 |
| 8,018,056 B2 | 9/2011 | Hauenstein | 257/730 |
| 8,368,210 B2 | 2/2013 | Hauenstein | 257/724 |
| 8,410,720 B2 | 4/2013 | Holec et al. | |
| 2004/0252462 A1 | 12/2004 | Cromwell et al. | |
| 2005/0161797 A1 | 7/2005 | Miller | |
| 2005/0174744 A1 | 8/2005 | Zheng | |
| 2008/0098895 A1 * | 5/2008 | Sato | B03C 3/383 96/54 |
| 2009/0004547 A1 * | 1/2009 | Vitella | H01M 8/0247 429/457 |
| 2009/0021895 A1 * | 1/2009 | Purves | H01R 9/24 361/641 |
| 2010/0284155 A1 | 11/2010 | Stolze et al. | |
| 2011/0011633 A1 | 1/2011 | Uchida et al. | |
| 2011/0193491 A1 | 8/2011 | Choutov et al. | |
| 2011/0210568 A1 | 9/2011 | Williams | |
| 2011/0221268 A1 | 9/2011 | Kanazawa et al. | |
| 2011/0222244 A1 * | 9/2011 | Takashiro | H02M 7/003 361/704 |
| 2013/0062751 A1 * | 3/2013 | Takagi | H01L 23/3675 257/692 |
| 2013/0063184 A1 | 3/2013 | Liang et al. | |
| 2013/0164567 A1 * | 6/2013 | Olsson | H01M 10/488 429/7 |
| 2013/0188397 A1 | 7/2013 | Wu et al. | |
| 2013/0248883 A1 | 9/2013 | Das et al. | |
| 2014/0183550 A1 | 7/2014 | Reusch et al. | |
| 2015/0189784 A1 | 7/2015 | Hirano et al. | |

OTHER PUBLICATIONS

Shengnan Li, "Packaging Design of IGBT Power Module Using Novel Switching Cells," Ph.D. dissertation, University of Tennessee, 2011, http://trace.tennessee.edu/utk_graddis/1205.

Bhattacharya, Subhashish, "15 kV SiC-IGBT Modules for Grid Scale Power Conversion," DE-AR0000110, Feb. 8, 2010, U.S. Department of Energy ARPA-E ADEPT Program, 15 pages.

Wade, Neal, et al., "Energy Storage for Power Flow Management and Voltage Control on an 11kV UK Distribution Network," 20th International Conference and Exhibition on Electricity Distribution (CIRED), Session 4, Paper 0824, Jun. 8-11, 2009, Prague, Czech Republic, IET, 4 pages.

Non-Final Office Action for U.S. Appl. No. 14/918,110, dated Apr. 19, 2017, 13 pages.

Notice of Allowance for U.S. Appl. No. 14/918,110, dated Aug. 10, 2017, 7 pages.

Invitation to Pay Additional Fees and Partial International Search for International Patent Application No. PCT/US2016/046780, dated Apr. 12, 2017, 8 pages.

International Search Report and Written Opinion for International Patent Application No. PCT/US2016/046780, dated Jun. 6, 2017, 19 pages.

International Search Report and Written Opinion for International Patent Application No. PCT/US2014/061109, dated Jan. 19, 2015, 8 pages.

International Preliminary Report on Patentability for International Patent Application No. PCT/US2014/061109, dated Apr. 28, 2016, 7 pages.

* cited by examiner

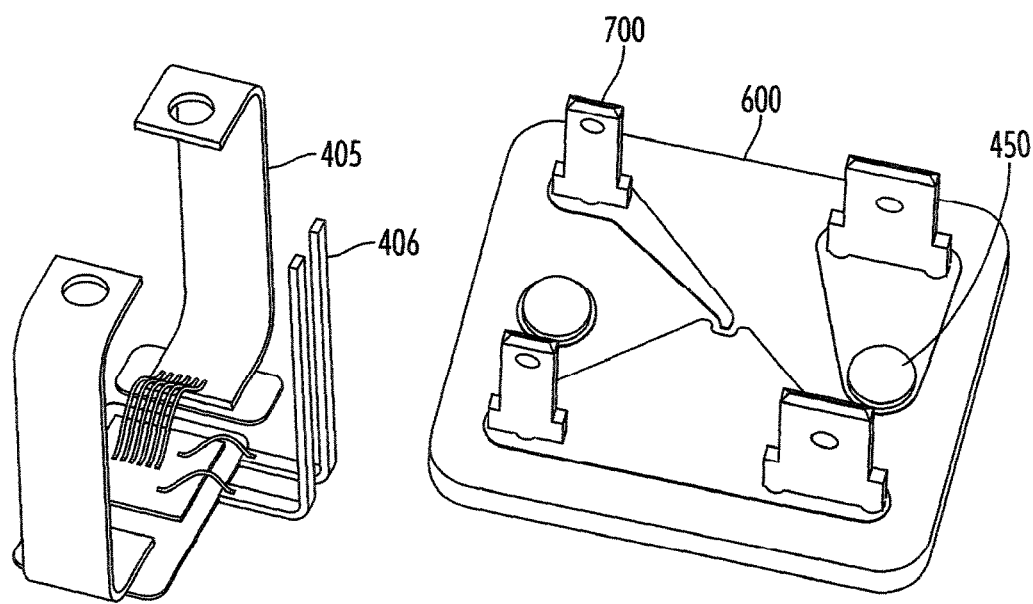
*FIG. 4a*  *FIG. 4b*

HIGH VOLTAGE POWER CHIP MODULE

CROSS-REFERENCE TO RELATED APPLICATIONS

This application claims priority to and is a continuation-in-part of U.S. Provisional Patent Application Ser. No. 61/892,187, filed on Oct. 17, 2013 entitled DESIGN AND DEVELOPMENT OF A LOW COST, MANUFACTURABLE HIGH VOLTAGE (HV) POWER MODULE FOR ENERGY STORAGE SYSTEMS which is hereby incorporated by reference in its entirety.

STATEMENT REGARDING FEDERALLY SPONSORED RESEARCH OR DEVELOPMENT

This invention was made with government support under grant DE-SC0008239 awarded by the United States Department of Energy. The United States government has certain rights in the invention.

RESERVATION OF RIGHTS

A portion of the disclosure of this patent document contains material which is subject to intellectual property rights such as but not limited to copyright, trademark, and/or trade dress protection. The owner has no objection to the facsimile reproduction by anyone of the patent document or the patent disclosure as it appears in the Patent and Trademark Office patent files or records but otherwise reserves all rights whatsoever.

BACKGROUND OF THE INVENTION

1. Field of the Invention

The present invention relates to improvements in high voltage power modules. More particularly, the invention relates to improvements particularly suited for providing a low profile module with low parasitic losses, high voltage capability, and operation at high temperatures.

2. Description of the Known Art

As will be appreciated by those skilled in the art, power modules are known in various forms. Power modules or packages are known in various forms. Patents include U.S. Pat. No. 7,687,903, issued to Son, et al. on Mar. 30, 2010, entitled Power module and method of fabricating the same; U.S. Pat. No. 7,786,486 issued to Casey, et al. on Aug. 31, 2010, entitled Double-sided package for power module; U.S. Pat. No. 8,018,056 issued to Hauenstein on Sep. 13, 2011, entitled Package for high power density devices; U.S. Pat. No. 8,368,210 issued to Hauenstein on Feb. 5, 2013, entitled Wafer scale package for high power devices; U.S. Pat. No. 6,307,755 issued to Williams, et al. on Oct. 23, 2001, entitled Surface mount semiconductor package, die-leadframe combination and leadframe therefore and method of mounting leadframes to surfaces of semiconductor die. Additional articles include: R. K. Ulrich and W. D. Brown, "Advanced Electronic Packaging," New Jersey: John Wiley & Sons, Inc., 2006, p. 203; and Shengnan Li, "Packaging Design of IGBT Power Module Using Novel Switching Cells," Ph.D. dissertation, University of Tennessee, 2011, http://trace.tennessee.edu/utk_graddiss/1205. Each of these patents and publications are hereby expressly incorporated by reference in their entirety. From these prior references it may be seen that these prior art patents are very limited in their teaching and utilization, and an improved power module is needed to overcome these limitations.

SUMMARY OF THE INVENTION

The present invention is directed to an improved power module for use in high voltage high temperature operations. In accordance with one exemplary embodiment of the present invention, a power die module is provided using a baseplate supporting sidewalls that form an interior compartment. A power substrate is mounted in the interior compartment with threaded inserts attached to the power substrate and a printed circuit board is positioned above the power substrate and bolted to the power substrate using the threaded inserts. One or more high voltage power die are mounted to the printed circuit board and then are compressively held between the power substrate and the printed circuit board so that electrical contacts on the top and bottom of the power die make electrical contact with either the power substrate or the printed circuit board. Blade connectors extend upward from the printed circuit board through blade apertures in a lid. The lid includes corona extenders positioned around the blade apertures to allow for high voltage applications while maintaining a small size lightweight package. The sidewall has a perimeter that also includes one or more corona extenders. These and other objects and advantages of the present invention, along with features of novelty appurtenant thereto, will appear or become apparent by reviewing the following detailed description of the invention.

BRIEF DESCRIPTION OF THE SEVERAL VIEWS OF THE DRAWINGS

In the following drawings, which form a part of the specification and which are to be construed in conjunction therewith, and in which like reference numerals have been employed throughout wherever possible to indicate like parts in the various views:

FIG. 3a shows the thermal-mechanical stress induced on the high voltage power die at 200° C. for a conventional die attach 310 3a.

FIG. 4a shows a CAD model of the conventional high voltage packaging approach.

FIG. 4b shows a CAD model of the present invention approach.

DETAILED DESCRIPTION OF THE INVENTION

Figures 1A, 1B:
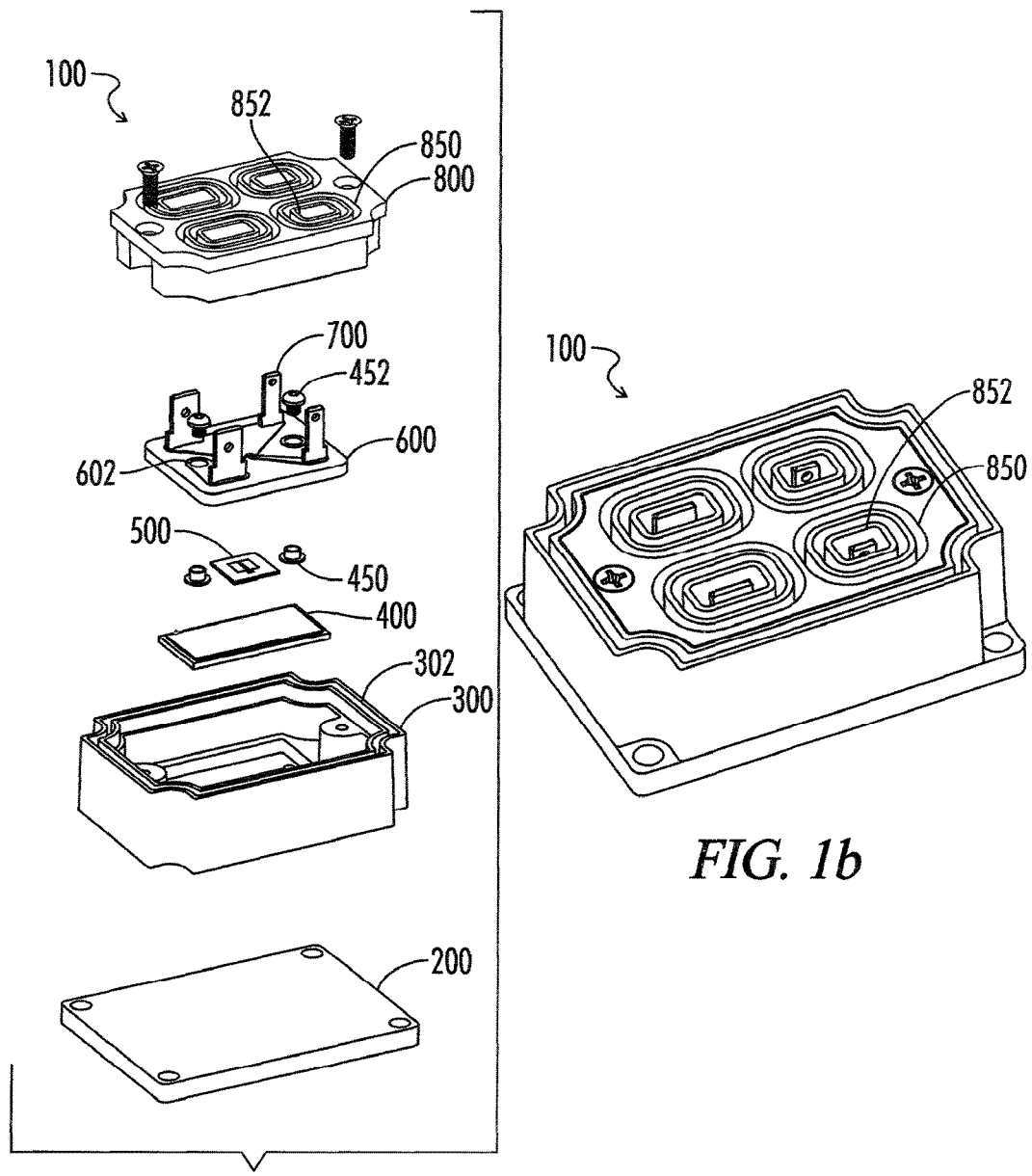
FIG. 1a shows an exploded view of the high voltage, 15 kV, discrete power die module 102.
FIG. 1b shows a collapsed, fully assembled image of the discrete power die module 102.

FIGS. 1 through 14 show the power modules 100, 102 and the testing results from these modules. FIG. 1 shows an exploded view of the high voltage low parasitic loss discrete chip power module 100 or discrete package 100 design highlighting the key components of the package 100 including a baseplate 200, sidewalls 300, power substrate 400, threaded inserts 450, high voltage power die 500, printed circuit board 600 defining bolt apertures 602, compression force bolts 452, blade connectors 700, and lid 800.

Copper was chosen as the baseplate 200 material. Copper has a high thermal conductivity and since the baseplate 200 and power substrate 400 are both relatively small, bowing was not a major concern.

A single part, high temperature sidewall 300 was used to enclose the components. The sidewall 300 includes a corona extender 302 and also provides mechanical protection of the power die 500. The corona extender and sidewall material provide electrical isolation of the external blade connections 700/power substrate 400 and baseplate 200.

In order to electrically isolate the baseplate 200 from the power die 500, direct bond copper comprised of Cu, 12 mil/AlN, 40 mil/Cu, 12 mil, was attached to the baseplate using Pb95Sn5 solder. At the same time, threaded inserts were soldered to the direct bond copper to allow the die 500 attached to the printed circuit board 600 to be mechanically and electrically connected to the direct bond copper. The main purpose of the printed circuit board 600 was to route the gate and anode/source interconnections to the blade connectors 700. This was achieved using a power flip-chip attach method on the bottom side of the board followed by an underfill which isolated the top side connections of the die 500 from the bottom side connections. Blade connectors 700 were chosen as the external connection method, which can be soldered directly to a printed circuit board gate driver board, connected to surface mount female blade connectors, or connected to external bussing. For discrete packages, blade and pin connectors are very common. However, since multi chip power modules 102 typically use bolted connections, the final high voltage multi chip power module 102 discussed infra uses bolted external connections for bussing. Lastly, a high temperature plastic lid 800 was designed to electrically isolate the blade connectors.

As shown in FIGS. 1a and 1b, corona extenders 850 were built into the lid 800 and designed around the blade apertures 852 formed through the lid 800 to allow for the appropriate creepage and clearance distances for 15 kV operation. The corona extenders are shown as corona rings. To this end, the invention used UL creepage and clearance distances as a guideline to meet the high voltage requirements of the package. According to these standards the maximum clearance air voltage rating is 25.5 kV at sea level. For the creepage distance, the values must be extrapolated since only operating voltages of 10 kV and lower are provided. Nonetheless, for a pollution degree of 1, the voltage rating of the package due to creepage distances is 15 kV. For pollution degree of 2, the voltage rating of the package is 12 kV. Since the discrete demonstrator was initially designed for testing in laboratory environment, a pollution degree of 1 is sufficient. However, when the multi chip power module 102 was designed, a pollution degree of 2 was assumed. It is important to point out that the pollution degree is heavily dependent on both the application environment and the system design. In most cases, a pollution degree of 2 would be sufficient since most system designs use particle filters to reduce or completely eliminate particles from entering an electronics enclosure. Thus, designing for a pollution degree of 2 with an acceptable factor of safety for a specific voltage rating will be sufficient for the multi chip power module 102 design.

Figure 2A:
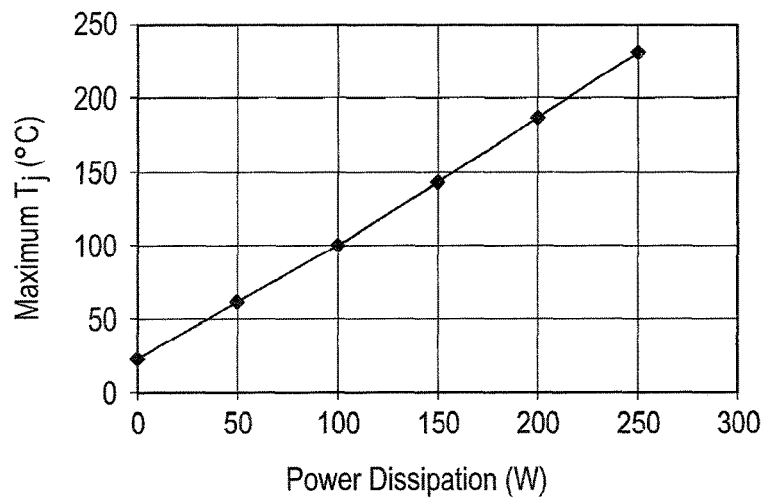
FIG. 2a shows the maximum die junction temperature as a function of power dissipation.
Figure 2B:
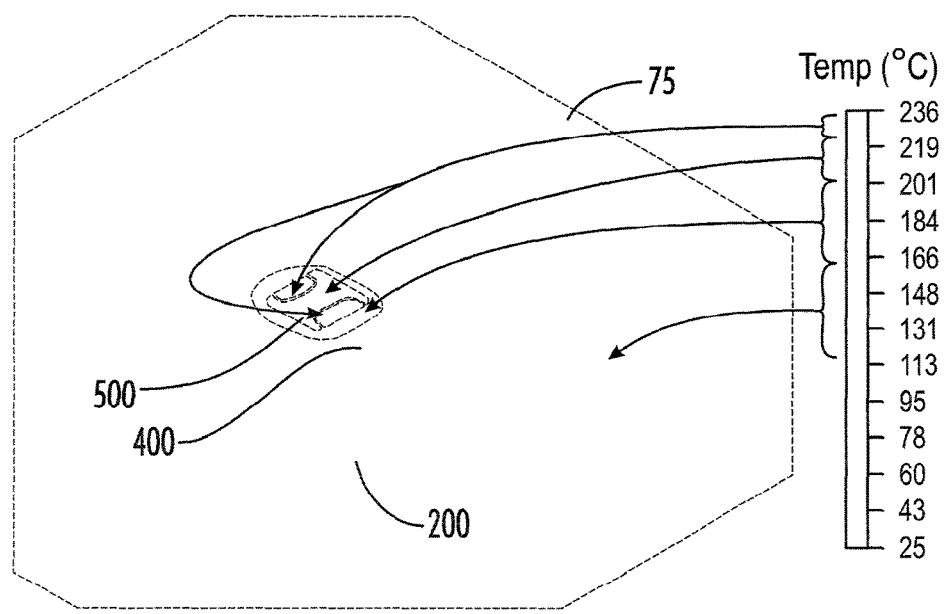
FIG. 2b shows the simulated thermal profile for 250 W of power loss.

FIG. 2a shows the maximum die 500 junction temperature as a function of power dissipation and FIG. 2b shows the simulated thermal profile for 250 W of power loss. From the thermal model, the junction to case thermal resistance was roughly 0.25° C./W. Three-dimensional FEA thermal modeling of the discrete package was performed using a computer simulator to verify the low junction to case thermal resistance and determine the maximum power dissipation per die 500 using a passively cooled heatsink. In order to simplify the model and reduce computation time, insignificant features were suppressed leaving the power die 500, power substrate 400, and baseplate 200. To further reduce computation time, a plate of aluminum 75 was mounted to the baseplate 200 to represent a heatsink. A convection of coefficient of 230 W/m²·K was applied to the bottom surface of the aluminum plate. A high quality mesh was applied to each of the layers and the maximum die 500 junction temperature and case temperature were modeled as a function of the power dissipation from 50-250 W in increments of 50 W. As shown in FIGS. 2a and 2b, for a power dissipation of 200 W, the die 500 junction temperature is below 200° C., which is a typical maximum operation temperature for SiC power die 500. This high power dissipation is achievable due to the low junction to case thermal resistance of 0.25° C./W, which stems from using high thermal conductivity packaging materials coupled with the relatively large area power die 500. This model uses a Cree 10 kV MOSFET that is 8.1 mm×8.1 mm. For reference, typical TO style discrete packages are 0.60° C./W–0.65° C./W.

Figure 3A:
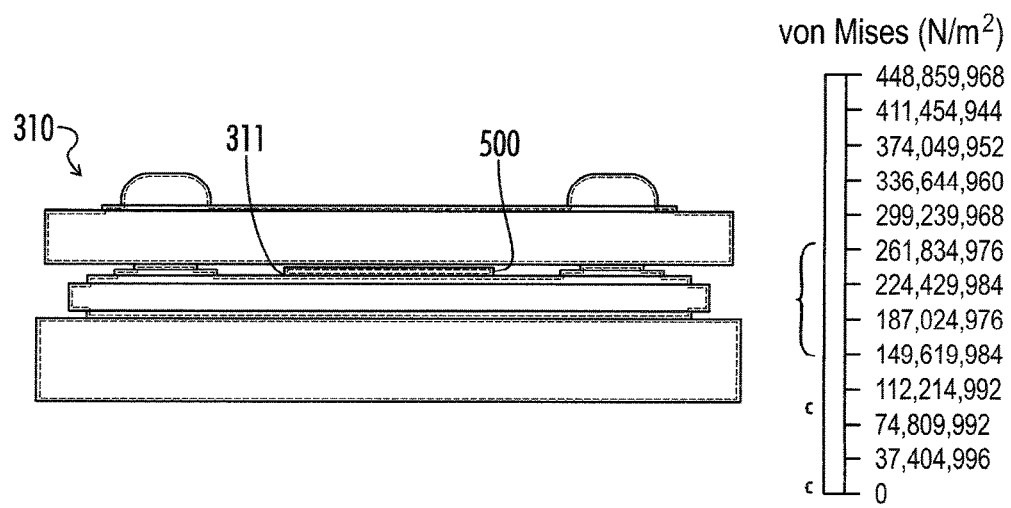
Figure 3B:
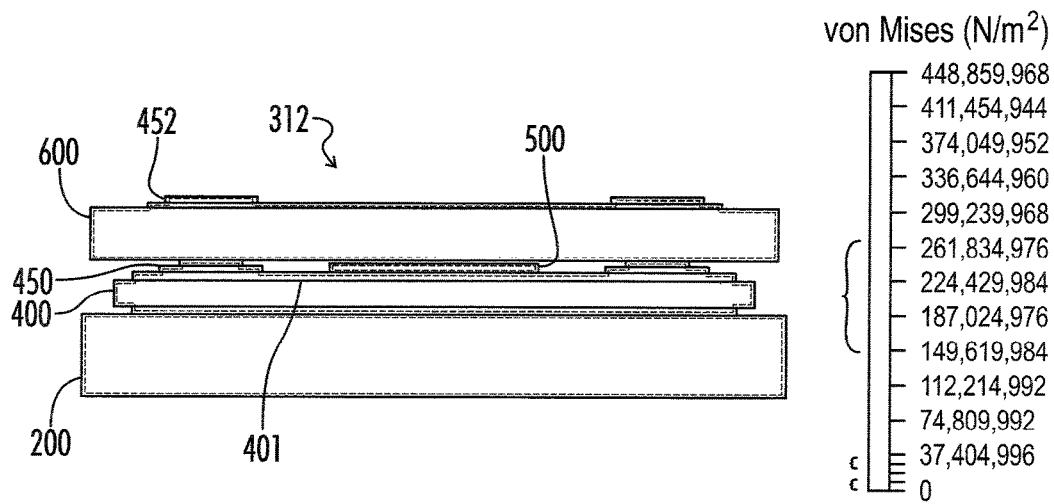
FIG. 3b shows the thermal-mechanical stress induced on the high voltage power die at 200° C. for a die pressure contact 312.

FIG. 3 shows the thermal-mechanical stress induced on the high voltage power die 500 at 200° C. for a conventional die attach 310 and for the present inventions die pressure contact 312. One of the potential benefits of using a pressure die contact to the power substrate 400, besides reworkability, is the reduction in stress on the die 500 at elevated temperatures. For a conventional die attach 310, flux-free solders 311 such as Au80Sn20 are used to achieve a relatively high thermal conductivity, low coefficient of thermal expansion, CTE, bond between the die 500 and power substrate. However, at high temperatures>150° C., due to the CTE mismatch among the die 500, power substrate 400, and baseplate 200, stresses are induced in the conventional attach die 500 that may cause premature failure. Another major drawback of using Au80Sn20 is its low ductility compared to other solders. Thus, die 500 attach solder selection for high temperature operation of power electronics is a well-known problem in the industry.

One solution is to use a die pressure contact 312 that relies on a small amount of continuous force applied to the die 500 to ensure that the drain or cathode pad is in contact with the power substrate 400 trace 401. As previously mentioned, this can be achieved by submounting the die 500 to a high Rjc=0.25° C./W temperature printed circuit board 600 and bolting the printed circuit board 600 to the package such that the bottom pad of the die 500 is intimately connected to the power substrate 400 trace 401. In order to ensure that the contact has high thermal and electrical conductivity with the power substrate 400, a soft preform material such as Pb95Sn5 or Pb95In5 is used.

FIG. 3 shows the thermal-mechanical stress induced on the high voltage power die 500 at 200° C. for a conventional die attach 310 and for the die pressure contact 312. As shown in FIG. 3, the power die 500 has a significant amount of stress for the conventional case compared to the pressure contact method. In order to quantify this value for both cases, the average stress was calculated in each of the die 500 bodies. The average stress is more representative of the stress induced on the die 500 as opposed to identifying the maximum stress. The maximum stress in the power die 500 is similar in both cases. However, for the pressure attach, the net stress induced in the power die 500 are minimized throughout the die 500. Hence, the purpose of calculating the average stress throughout the entire die 500. The average stress on the die 500 for the conventional and die 500 pressure contact was 88 MPa and 33 MPa, respectively. This is roughly 2.5× the stress in the high voltage power die 500 using a conventional die attach 310 approach.

FIG. 4a shows a CAD model of the conventional high voltage packaging approach and FIG. 4b shows the present invention's high voltage packaging approach. One of the key benefits of this packaging approach was the reduction of package parasitics. Parasitic reduction translates to increased system efficiency and improved reliability. In order to quantify and analyze the invention's low parasitic packaging approach, the high voltage discrete package was modeled and the parasitic impedances were extracted. As a comparison, a high voltage discrete packaging approach analogous to existing high voltage Si IGBT power bricks was modeled as well. The models were designed in computer models where rigorous electromagnetic simulations were performed on each of the packages.

As shown in the FIG. 4, conventional high voltage packaging approaches extend the power leads 405 as well as the gate and sense connections 406 in order to achieve the desired voltage isolation. In contrast, the present invention uses high voltage corona extenders 850 designed into the lid 800 coupled with advanced high dielectric strength materials so that the height of these connections can be minimized further reducing parasitic impedances. In addition, a current streamline plot of the power loop for each of the packages is displayed in FIG. 5. A voltage drop of 1.6 mV and 0.5 mV for the conventional and invention package was calculated, respectively.

Figure 5:
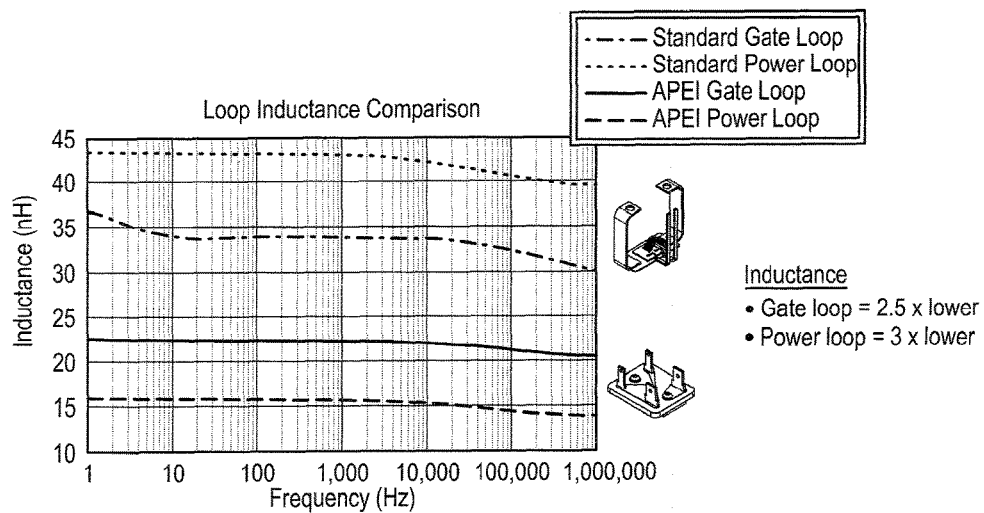
FIG. 5 shows the gate and power loop inductance for the conventional package and the Silicon Carbide package as a function of frequency up to 1 MHz.

The gate and power loop inductance for the conventional package and the invention's package as a function of frequency up to 1 MHz is displayed in FIG. 5. For the gate loop and power loop inductance, the conventional package is 1.5× and 3× larger compared to the invention's package, respectively.

Figure 6:
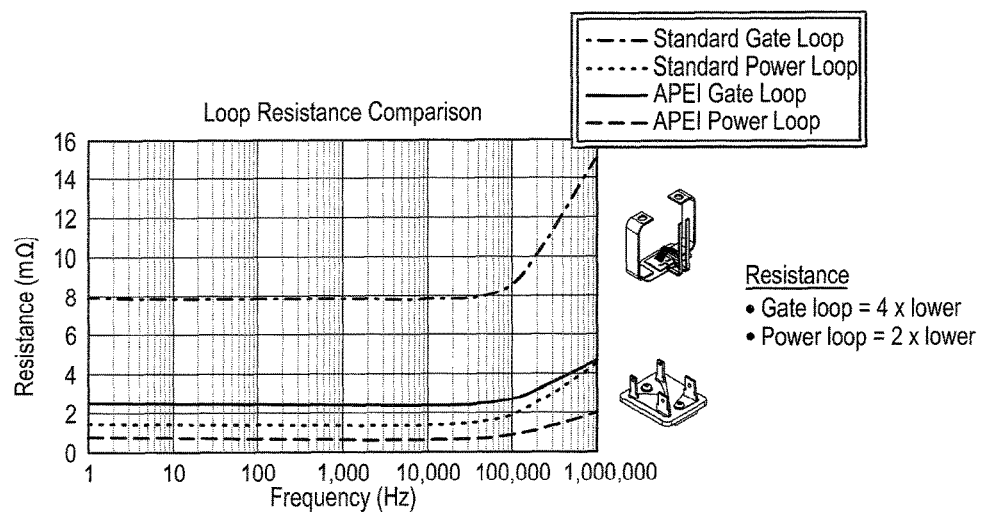
FIG. 6 shows the gate and power loop resistance for the conventional package and the silicon carbide package as a function of frequency up to 1 MHz.

The gate and power loop resistance for the conventional package and the invention's package as a function of frequency up to 1 MHz is displayed in FIG. 6. For the gate loop and power loop resistance, the conventional package is 4× and 2× larger compared to the invention's package, respectively.

It is important to mention that these simulations are based on the last high voltage discrete design. Thus, iterative design improvements were not made on the discrete package based on these results. Nonetheless, these finding were taken into consideration during the design of the high voltage SiC multi chip power module 102.

Figure 7:
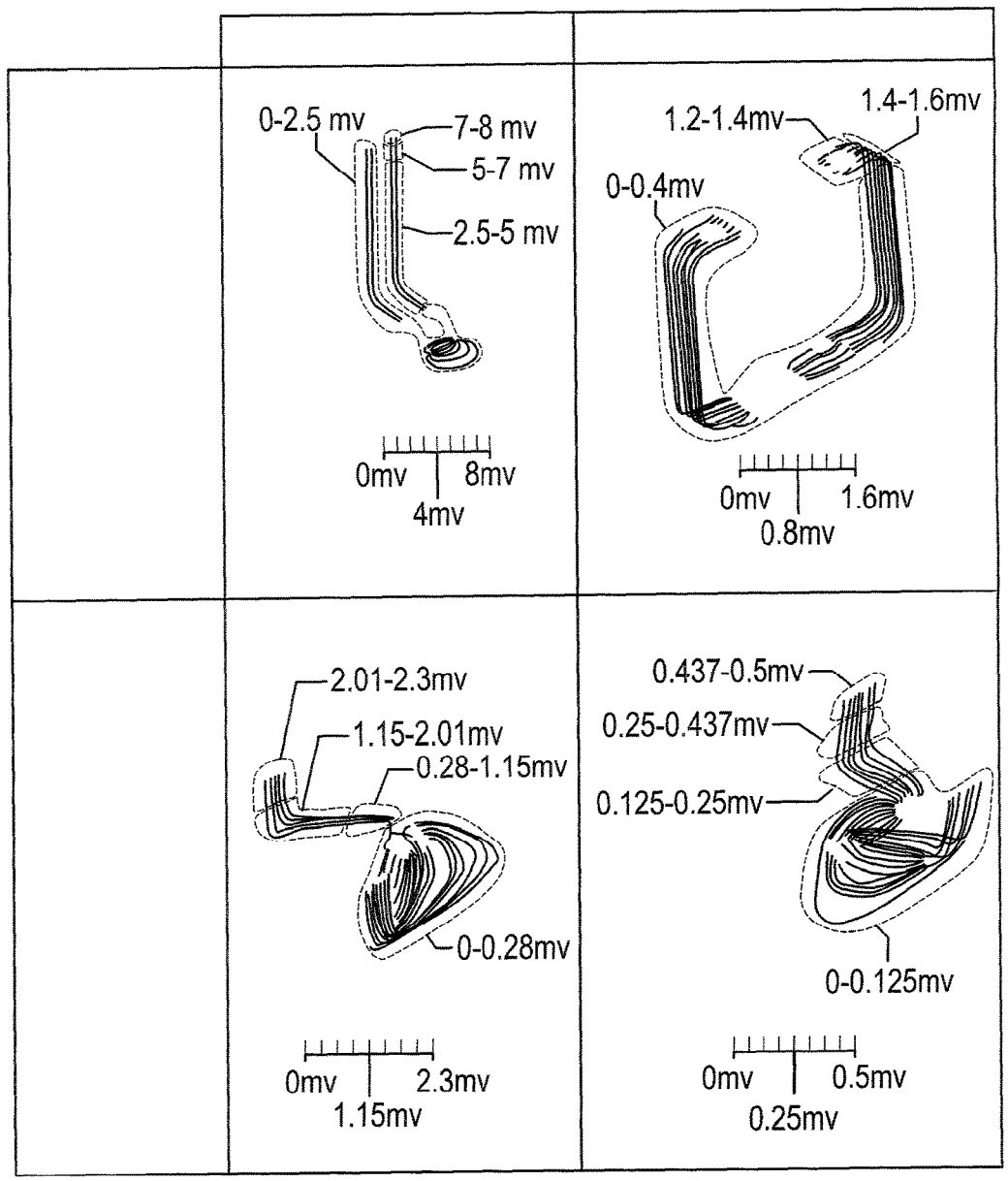
FIG. 7 shows the streamline paths at 1 kHz for the conventional high voltage package design and the invention's high voltage low parasitic package design.

FIG. 7 shows the streamline paths at 1 kHz for the conventional high voltage package design and the invention's high voltage low parasitic package design. Current streamline plots of the power loop show the voltage drop across the loop. The streamline plot of the invention's discrete package was rotated 90 degrees counter-clock wise for viewing purposes.

FIG. 5 shows the gate and power loop inductances for the conventional package and the invention's package.

FIG. 6 shows the gate and power loop resistances for the conventional package and the invention's package.

In order to verify that the power flip-chip die 500 attach is electrically connected to each of the pads and does not damage the device during the attach process, the forward blocking voltage characteristics as well as the forward gate current were measured for three samples. Before the power die 500 were attached to the printed circuit board, the bare die 500 were probed to analyze any change in the blocking voltage or forward current characteristics. 5 kV/40 A thyristors were acquired from GeneSiC and used to validate the attach process.

Figure 8:
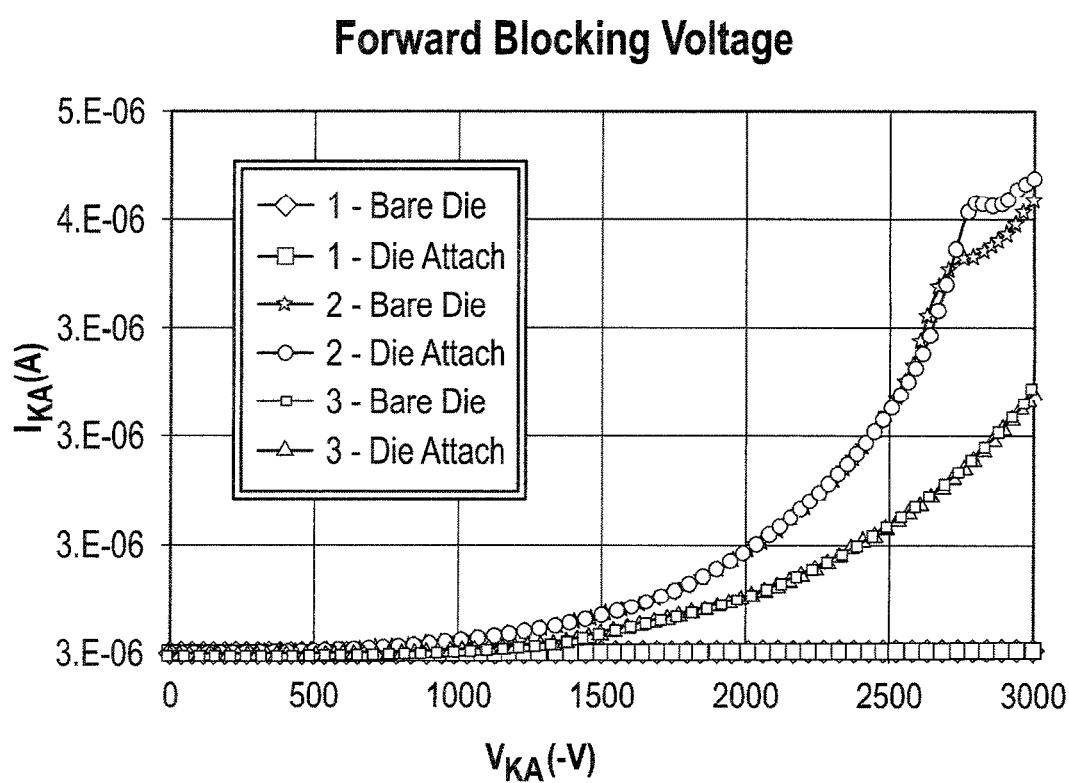
FIG. 8 shows the leakage current as function of the forward blocking voltage up to 3 kV for bare die and post-die attach and underfill.

FIG. 8 shows the leakage current as function of the forward blocking voltage up to 3 kV. All three samples have very similar leakage currents between the bare die 500 and processed devices. Due to the low leakage current of Sample 1, it is difficult to verify the difference between the two curves from the scale of the graph. Nevertheless, Sample 1 leakage currents are within 2 nA from one another. Presently, 3 kV is the maximum voltage of the Agilent 1505A curve tracer. In order to apply a higher bias voltage, an external high voltage power supply was used to confirm blocking voltage up to 5 kV for each of the samples.

The next measurement was to verify that the gate pad of the die 500 was connected to the gate trace on the printed circuit board 600. The forward gate current of the top p-n junction of the thyristor was measured as a function of the gate voltage before and after the die 500 was attached and underfilled on the printed circuit board 600 as shown in FIG. 3. As expected, the gate current is slightly higher after die 500 attach and underfill due to reduction in contact resistance at the die 500 to printed circuit board interface. When the bare die 500 were measured, high current probes were used to contact the anode pads, which will slightly increase the contact resistance due to the limited contact area. In any case, all of the samples demonstrate a good connection between the die 500 and printed circuit board 600.

FIG. 8 shows the leakage current as a function of the forward blocking voltage for bare die and post-die attach and underfill.

Figure 9:
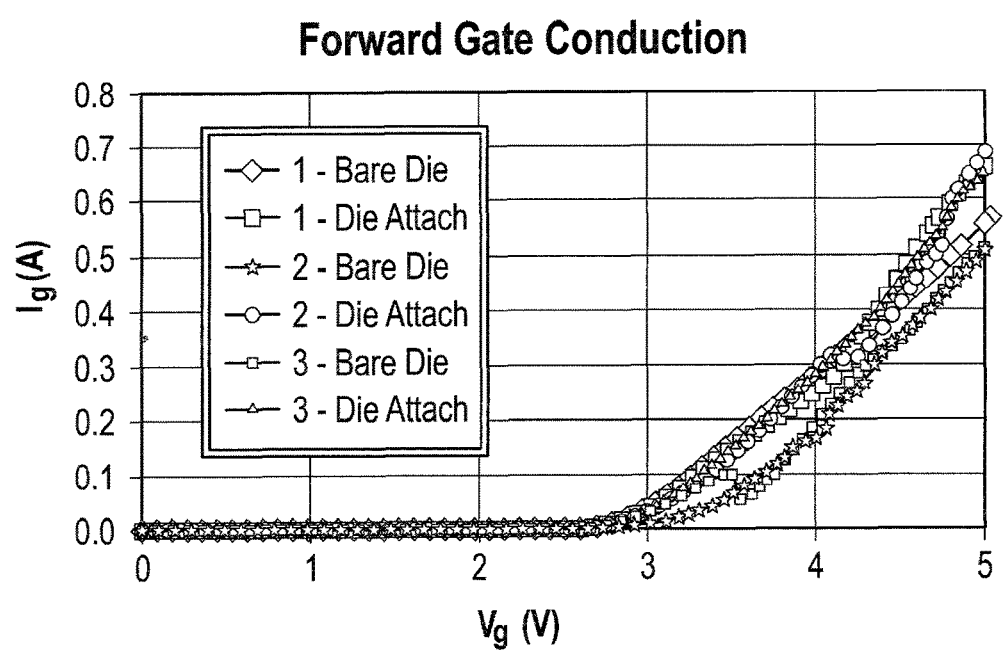
FIG. 9 shows the forward gate current across the top p-n junction of the thyristor.

FIG. 9 shows the forward gate current across the top p-n junction of the thyristor.

A mechanical printed circuit board 600, with no die, but including blade connectors 700 was inserted into the package followed by the lid 800 and the high voltage characteristics were tested as a function of temperature. As a first attempt, a silicone gasket with silicone grease applied to the interfaces was used to electrically isolate the power substrate 400 from the top of the printed circuit board 600 and the blade connectors 700. A bias voltage was applied across the cathode/drain and anode/source and swept from 0 kV to 15 kV as a function of temperature at 25° C., 50° C., 100° C., 150° C., and 200° C. A maximum blocking voltage of 15 kV was achieved at 150° C. The package was tested at 200° C. and the passivation materials began to breakdown below 5 kV. It is important to note that the silicone grease that was used was not a high temperature grease and, consequently, was only rated to 200° C. Thus, for future experiments, a higher temperature grease that has a stable dielectric strength over temperature could be used to extend the blocking voltage to higher temperatures. In addition, once this packaging approach is integrated into the multiple die module 102 discussed herein, due to the larger footprint, traces and connectors can be significantly spaced out compared to the discrete package. Thus, high voltage design requirements become less of a challenge.

A silicone gel was dispensed into the package to replace the silicone gasket and grease as a passivation material. The package was then tested up to 15 kV over temperature. Blocking of 19 kV was achieved at a maximum temperature of 225° C.

A high voltage SiC half-bridge was designed to house four high voltage SiC power die 500 which consist of the Cree 10 kV SiC MOSFET, Cree 15 kV SiC IGBT, Cree 10 kV Schottky diode, and GeneSiC 9 kV SJT. As a result, the multi chip power module 102 will have three different ratings depending on the high voltage power die 500 utilized as shown below:

SiC IGBT multi chip power module 102=15 kV/100 A
SiC MOSFET multi chip power module 102=10 kV/50 A
SiC SJT multi chip power module 102=9 kV/60 A It was decided to match the footprint of the SiC half-bridge multi chip power module 102 to the standard commercially available single switch 6.5 kV IGBT footprint of 73 mm×140 mm. Since the current rating of high voltage SiC power die 500 is presently lower than Si IGBTs, the additional area is needed to reach a meaningful multi chip power module 102 current rating. In addition, a large footprint reduces the thermal resistance of the multiple chip module 102, which is a key characteristic in removing heat from the power die 500. It is important to point out that although the footprint of the invention's multi chip power module 102 design is similar to commercially available Si-based multi chip power module 102s, the thickness of the invention's design is significantly thinner than commercial modules. As previously discussed and modeled, the height of the module 102 and, ultimately, the height of the connectors have a large impact on the package parasitic impedances. Thus, the volume of the invention's high voltage >15 kV, half-bridge multi chip power module 102 design is substantially less than a commercially available 6.5 kV Si IGBT multi chip power module 102 design.

Figure 10:
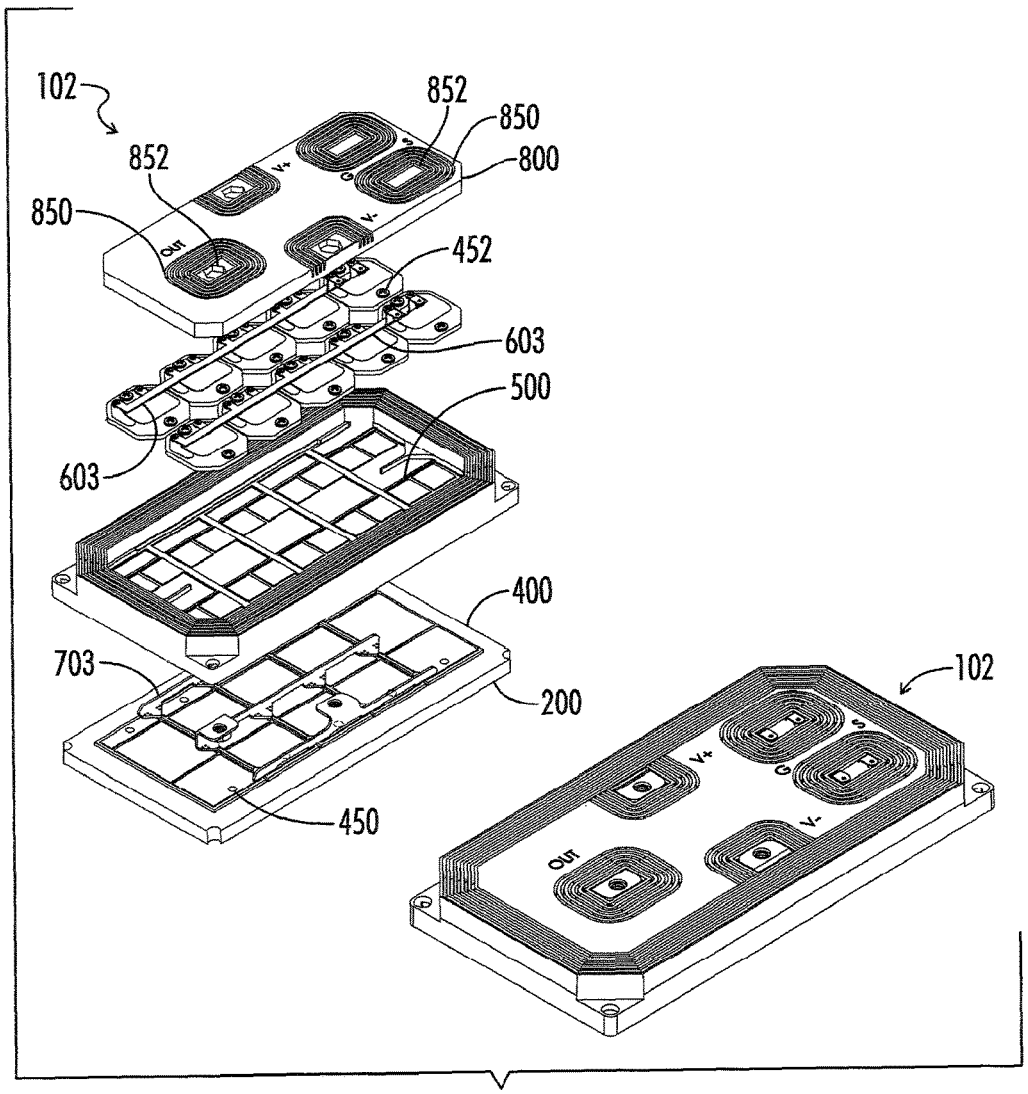
FIG. 10 shows an exploded and a collapsed CAD render of the high voltage SiC multi chip power module 102.

An exploded view and collapsed image of the high voltage multi chip power module 102 design is displayed in FIG. 10. This design 102 is based on the high voltage discrete package that was previously discussed and demonstrated. In order to reduce module 102 stress and baseplate 200 bow, individual AlN direct bond copper power substrates comprised of a single switch/diode half-bridge are soldered to a metal-matrix composite, MMC, baseplate 200. Metal-matrix composite, MMC, materials typically have a low CTE and low density enabling a low CTE mismatch between the baseplate 200 and power substrate 400. In addition, since the baseplate 200 is the densest component of the power module 102, using a metal matrix composite can reduce the weight 5× or more. Three blade 700 like power leads 703 for +V, −V, and Out are soldered directly to the power substrates 400 and interleaved between the interconnection boards 600 to short each of the power substrates 400 at the appropriate node. The power leads 703 route through the plastic lid 800 and are bent once the lid 800 is intact to create captive nut bolted connections.

Similar to the discrete package 100, the gate and source of the high voltage power die 500 are attached to high temperature printed circuit boards 600, shown as interconnection boards 600. The interconnection boards 600 are then bolted 452 to the power substrates 400 using threaded inserts 450. For future revisions of this design, it would be advantageous to design the interconnection boards 600 such that the connections directly plug into the power substrate 400 eliminating the need to bolt 452 the boards 600 to the power substrate 400. However, for a first prototype, bolted connections are sufficient.

The gate and sense interconnections 603 for each switch position consist of copper busbars that are laminated and bent to provide bolted connections for the gate and sense. Thin, laminated busbars can be designed to provide access points for mounting gate resistors to balance switching events between paralleled die 500 in each switch position. Lastly, the high temperature plastic sidewalls 300 and lid 800 are used to provide mechanical protection from the environment and electrical isolation. The sidewalls 300 attach to the baseplate and surround the power die 500 and power substrate. The lid 800 bolts directly to the sidewalls 300 and FIG. 10 shows how corona extenders 850 are designed into both components in order to provide the proper creepage and clearance distance between the connections 603, 703 and baseplate 200. A fully assembled, collapsed image is shown in the figure highlighting the extremely low profile, 14 mm, especially for high voltage operation. FIG. 10 shows an exploded and a collapsed CAD render of the high voltage SiC multi chip power module 102. The module 102 dimensions are roughly 73 mm×140 mm×14 mm.

Figure 11:
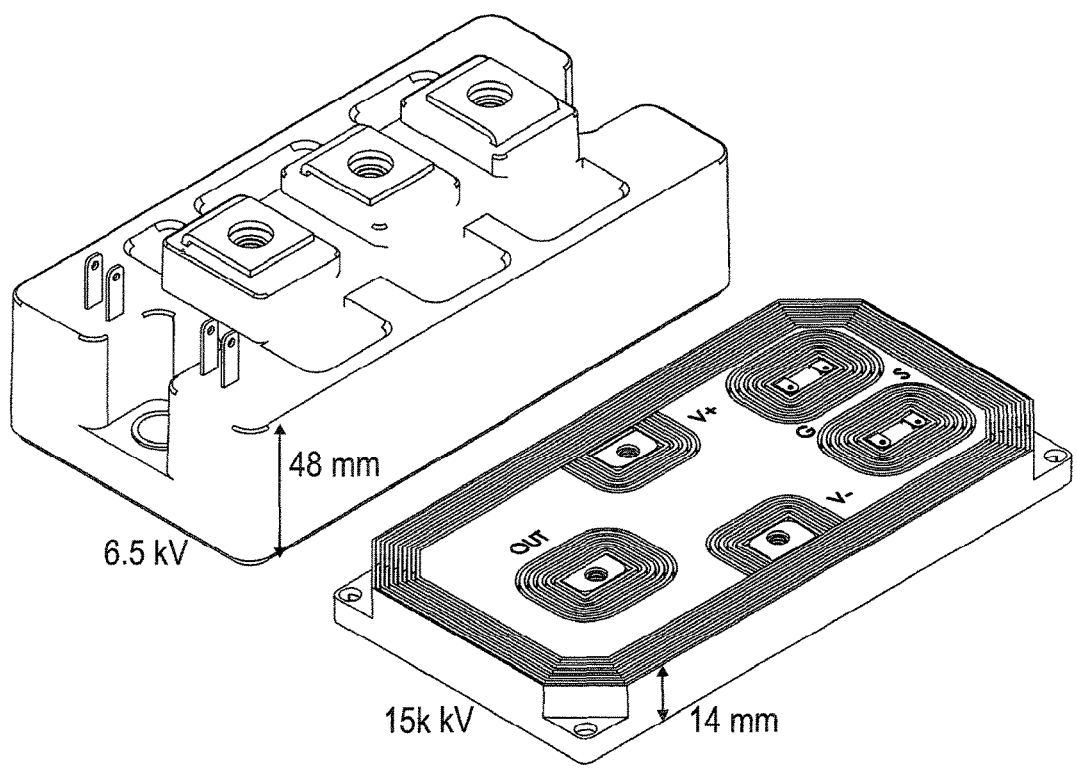
FIG. 11 shows a size comparison of The invention's high voltage, >15 kV, half-bridge SiC multi chip power module 102 design compared to a commercial 6.5 kV Si IGBT single switch multi chip power module 102.

As a size comparison, the invention's high voltage module 102 was compared to a commercial 6.5 kV Si IGBT as shown in FIG. 11. The footprint was intentionally designed to match the existing commercial modules 102 as a drop-in replacement. However, the thickness and, consequently, volume of the invention's SiC high voltage multi chip power module 102 is 3× less than its commercial counterpart. For multi-level systems where multiple modules 102 are used in a system, this additional volume savings is extremely beneficial. In addition, the parasitic impedances are significantly reduced improving system performance and efficiency.

One of the challenges of designing for high voltage operation is to provide the proper creepage and clearance distances required by standards such as UL 840 or IEC60950-1. This is accomplished using design features, i.e., corona extenders 850, and materials, i.e., 40 mil AlN ceramic substrates, to insulate the potential carrying auxiliary and power terminals 603, 703 from the baseplate 200 and other connectors. The creepage distance is a function of the operating voltage according to UL 840 standards. At 15 kV, the minimum creepage distance is 75 mm, ~3 in., for a pollution degree of 2. This means that a minimum distance along the surface of insulating materials in the multi chip power module 102, between the connectors 603, 703 and baseplate, must be at least 75 mm. In order to achieve this requirement, corona extenders 850 were designed around the frame of the plastic sidewalls 300 as well as the lid 800 enclosing the connectors. Moreover, the minimum clearance distance in the module 102 is between the high/low connections of the half-bridge and midpoint which was 26 mm, ~1 in. This allows for a 20 kV operation voltage at 2000 m above sea level.

Computer modeling finite element simulation was used in order to validate die 500 junction temperatures as a function of the power dissipation and, ultimately, calculate the junction to case thermal resistance per half-bridge switch position. Ten 10 mm×10 mm high voltage power die 500 were inserted per switch position consisting of five high voltage SiC switches and five high voltage SiC Schottky diodes. This is the maximum size of presently available high voltage power die 500. In order to reduce simulation time and increase meshing resolution in critical areas of interest, only relevant components were taken into consideration in the model and insignificant features were suppressed.

Figure 12:
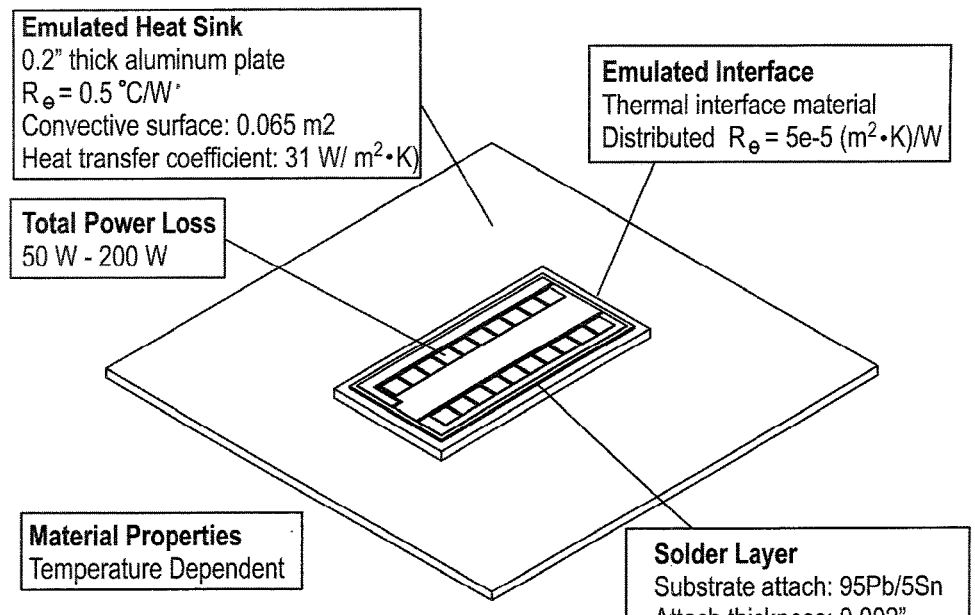
FIG. 12 shows a high voltage SiC multi chip power module 102 mounted on a metal plate emulating a heatsink.

Since SiC power devices can typically operate at higher temperatures, >150° C., a passively cooled heatsink was investigated as means for heat extraction. Passive cooling simplifies the system design eliminating the need for fans. In addition, active cooling imposes a weight penalty due to its ducting, plumbing, and extra environmental control system capacity requirements. In order to simplify the model, a thick metal plate was included to simulate the effects of a heatsink. A heat transfer convection coefficient of 31 $W/m^2 \cdot K$ was applied to the lower surface which translated to a heatsink thermal resistance of 0.5° C./W. FIG. 12 shows the power module 102 mounted on a thick metal plate representing a heatsink with an equivalent thermal resistance as well as a few of the other model parameters used to accurately simulate the thermal characteristics of the multi chip power module 102.

Following the full model design, temperature dependent material properties were applied to each component. In addition, a high density mesh was applied to the full module 102 in order to begin the FEA process. An extremely useful feature in computer modeling is the ability to control the cell size of the mesh for each layer and/or component. Mesh controls were employed in order to concentrate elements in areas of interest, and lessened in larger, less critical structures. Careful application of mesh controls can substantially increase simulation accuracy without sacrificing computational efficiency. A schematic of the high density mesh for the power die, power substrate, and baseplate is displayed in FIG. 13.

FIG. 12 shows a high voltage SiC multi chip power module 102 mounted on a metal plate emulating a heatsink. A heat transfer convection coefficient representative of a passive heatsink thermal resistance was applied to the bottom side of the plate to cool the module 102.

Figure 13:
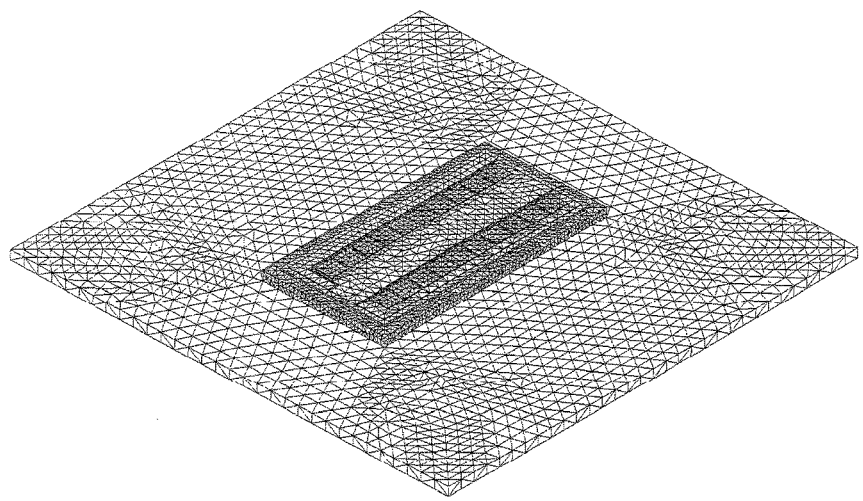
FIG. 13 shows a magnified image of the meshed model of the multi chip power module 102 displaying a high quality mesh for the each of the components and layers.

FIG. 13 shows a magnified image of the meshed model of the multi chip power module 102 displaying a high quality mesh for the each of the components and layers.

Figure 14:
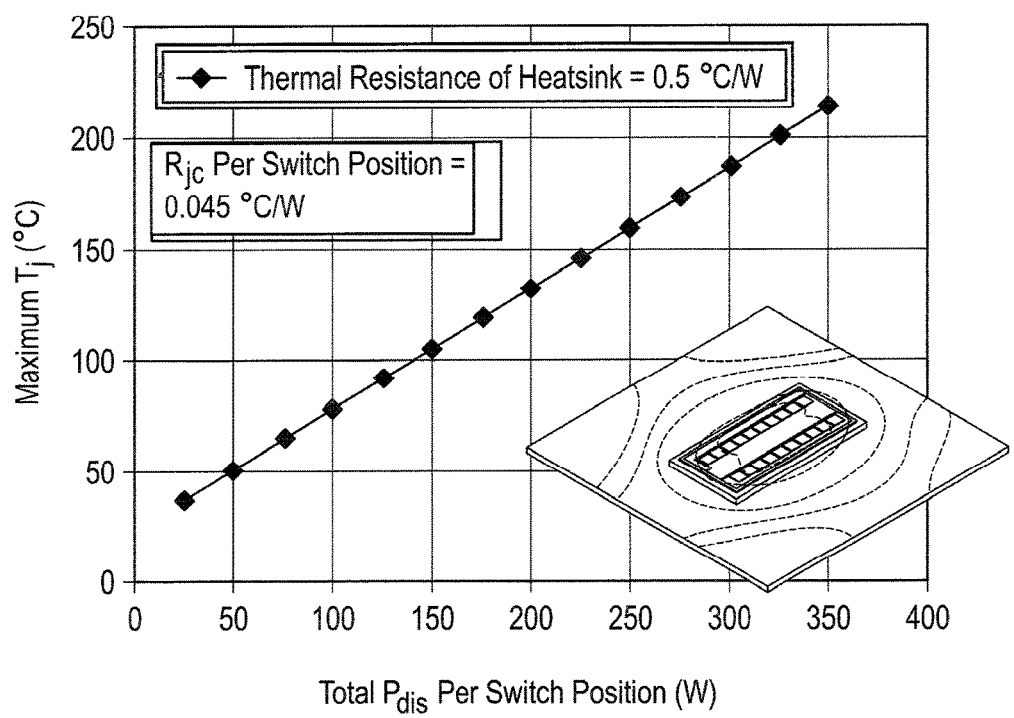
FIG. 14 shows a modeled thermal profile of the multi chip power module 102 when 200 W of power loss is applied evenly to all of the die and a graph of the maximum die junction temperature as a function of the total power dissipation per half-bridge switch position.

For the initial simulations, a range of power loss values were applied evenly to all of the power die 500 ranging from 50 W-200 W in increments of 50 W. FIG. 14 shows the thermal profile of the SiC high voltage multi chip power module 102 when a total of 200 W is dissipated evenly in both switch positions' power die 500. A maximum junction temperature of 145° C. was measured for a heatsink with a thermal resistance 0.5° C./W. From these results, the junction to case thermal resistance for each half-bridge switch position was calculated to be 0.045° C./W. Since the majority of the power loss is in the power transistor, this thermal resistance corresponds to five power die 500 in one switch position. Using this value, the maximum junction temperature as a function of the power dissipation per switch position was calculated and shown in FIG. 14. As shown in the figure, at ~300 W of power loss, the maximum die 500 junction temperature is below 200° C.

In the literature, high voltage 10 kV/10 A SiC MOSFETs have been reported to have conduction losses of 100 $W/cm^2$, 66 W, at 100° C. per die 500. The switching losses are highly dependent on the switching frequency. For example, switching losses vary between 4 $W/cm^2$, 2.6 W, at fsw=500 Hz to 160 $W/cm^2$, 105 W, at fsw=20 kHz. If turn-on and turn-off transitions are further reduced through soft switching techniques, the switching losses will significantly decrease. However, using the values in the report, high frequency operation, >5 kHz, requires a fan-cooled heatsink. Simply adding a fan to a heatsink to remove heat more efficiently from the multi chip power module 102 can reduce the thermal resistance of the heatsink to 0.1° C./W. For a total of 855 W of loss per switch position [5×( 66+105),], using a heatsink with a thermal resistance of 0.1° C./W equates to a maximum junction temperature of 150° C.

From the foregoing, it will be seen that this invention well adapted to obtain all the ends and objects herein set forth, together with other advantages which are inherent to the structure. It will also be understood that certain features and subcombinations are of utility and may be employed without reference to other features and subcombinations. This is contemplated by and is within the scope of the claims. Many possible embodiments may be made of the invention without departing from the scope thereof. Therefore, it is to be understood that all matter herein set forth or shown in the accompanying drawings is to be interpreted as illustrative and not in a limiting sense.

When interpreting the claims of this application, method claims may be recognized by the explicit use of the word 'method' in the preamble of the claims and the use of the 'ing' tense of the active word. Method claims should not be interpreted to have particular steps in a particular order unless the claim element specifically refers to a previous element, a previous action, or the result of a previous action. Apparatus claims may be recognized by the use of the word 'apparatus' in the preamble of the claim and should not be interpreted to have 'means plus function language' unless the word 'means' is specifically used in the claim element. The words 'defining,' 'having,' or 'including' should be interpreted as open ended claim language that allows additional elements or structures. Finally, where the claims recite "a" or "a first" element of the equivalent thereof, such claims should be understood to include incorporation of one or more such elements, neither requiring nor excluding two or more such elements.

What is claimed is:

1. A power module comprising:
    a module housing including an interior chamber;
    at least one power semiconductor die in the interior chamber; and
    a lid configured to be attached to the module housing and enclose the at least one power semiconductor die in the interior chamber, the lid comprising:
        at least one opening through which an electrical connector coupled to the at least one power semiconductor die is provided; and a corona extender surrounding the at least one opening, the corona extender comprising a plurality of raised concentric rings.

2. The power module of claim 1 further comprising an additional corona extender along a periphery of the lid, the additional corona extender comprising a plurality of raised concentric rings.

3. The power module of claim 1 wherein the power module is rated for operation at 15 kV according to UL 840 standards.

4. The power module of claim 1 wherein the electrical connector is a blade connector.

5. The power module of claim 1 wherein the module housing and the lid are plastic.

6. A power module comprising:
a power substrate comprising at least one trace;
a printed circuit board comprising a plurality of electrical connectors; and
a power semiconductor die comprising a plurality of contacts and compressively held between the power substrate and the printed circuit board such that each one of the plurality of electrical connectors are in electrical contact with a corresponding one of the plurality of contacts and at least one of the plurality of contacts is in electrical contact with the at least one trace.

7. The power module of claim 6 further comprising:
a module housing including an interior chamber in which the power substrate is provided; and
a lid configured to be attached to the module housing and enclose the at least one power semiconductor die in the interior chamber, wherein each one of the plurality of electrical connectors extend through the lid.

8. The power module of claim 7 wherein the lid comprises:
at least one opening through which one of the plurality of electrical connectors is provided; and
a corona extender surrounding the at least one opening, the corona extender comprising a plurality of raised concentric rings.

9. The power module of claim 8 further comprising an additional corona extender along a periphery of the lid, the additional corona extender comprising a plurality of raised concentric rings.

10. The power module of claim 8 wherein the power module is rated for operation at 15 kV according to UL 840 standards.

11. The power module of claim 8 wherein each one of the plurality of electrical connectors is a blade connector.

12. The power module of claim 8 wherein the module housing and the lid are plastic.

13. The power module of claim 6 wherein the power semiconductor die is rated to block at least 15 kV.

14. The power module of claim 6 wherein the power semiconductor die is configured to dissipate greater than 200 W of power while maintaining a junction temperature less than 200° C.

15. The power module of claim 6 wherein a thermal resistance between a junction of the power semiconductor die and the power substrate is less than about 0.25° C./W.

16. The power module of claim 6 wherein an average mechanical stress on the power semiconductor die is less than about 33 MPa.

17. The power module of claim 6 wherein:
a first one of the plurality of electrical connectors is coupled to a gate contact of the power semiconductor die; and
a second one of the plurality of electrical connectors is coupled to a source contact of the power semiconductor die, such that a gate control loop is defined between the first one of the plurality of electrical connectors and the second one of plurality of electrical connectors.

18. The power module of claim 17 wherein an inductance of the gate control loop is less than about 25 nH.

19. The power module of claim 6 wherein:
a first one of the plurality of electrical connectors is coupled to a source contact of the power semiconductor die; and
a second one of the plurality of electrical connectors is coupled to a drain contact of the power semiconductor die, such that a power loop is defined between the first one of the plurality of electrical connectors and the second one of the plurality of electrical connectors.

20. The power module of claim 19 wherein an inductance of the power loop is less than about 20 nH.

21. The power module of claim 6 wherein the power semiconductor die is rated to block at least 10 kV.

* * * * *